(12) United States Patent
Mai (10) Patent No.: US 11,647,602 B2
(45) Date of Patent: May 9, 2023

(54) VEHICULAR RADAR SENSOR WITH MECHANICAL COUPLING OF SENSOR HOUSING

(71) Applicant: Magna Electronics Inc., Auburn Hills, MI (US)

(72) Inventor: Christian Mai, Grossostheim (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 17/445,101

(22) Filed: Aug. 16, 2021

(65) Prior Publication Data

US 2021/0385963 A1    Dec. 9, 2021

Related U.S. Application Data

(62) Division of application No. 16/732,467, filed on Jan. 2, 2020, now Pat. No. 11,096,301.

(60) Provisional application No. 62/796,652, filed on Jan. 25, 2019, provisional application No. 62/787,774, filed on Jan. 3, 2019.

(51) Int. Cl.
*H05K 7/14* (2006.01)
*G01S 13/931* (2020.01)

(52) U.S. Cl.
CPC .......... *H05K 7/1427* (2013.01); *G01S 13/931* (2013.01)

(58) Field of Classification Search
USPC ................................ 361/728, 752, 796, 800
See application file for complete search history.

(56) References Cited

U.S. PATENT DOCUMENTS

| | | |
|---|---|---|
| 5,223,996 A | 6/1993 | Read et al. |
| 5,808,868 A | 9/1998 | Drekmeier |
| 6,587,186 B2 | 7/2003 | Bamji et al. |
| 6,674,895 B2 | 1/2004 | Rafii et al. |
| 6,678,039 B2 | 1/2004 | Charbon |
| 6,690,354 B2 | 2/2004 | Sze |
| 6,710,770 B2 | 3/2004 | Tomasi et al. |
| 6,753,473 B2 | 6/2004 | Barlian et al. |
| 6,825,455 B1 | 11/2004 | Schwarte |
| 6,876,775 B2 | 4/2005 | Torunoglu |
| 6,906,793 B2 | 6/2005 | Bamji et al. |
| 6,919,549 B2 | 7/2005 | Bamji et al. |
| 7,050,305 B2 | 5/2006 | Thorum |
| 7,053,357 B2 | 5/2006 | Schwarte |
| 7,157,685 B2 | 1/2007 | Bamji et al. |
| 7,176,438 B2 | 2/2007 | Bamji et al. |
| 7,203,356 B2 | 4/2007 | Gokturk et al. |

(Continued)

FOREIGN PATENT DOCUMENTS

WO    2011090484 A1    7/2011

*Primary Examiner* — Hung S. Bui
(74) *Attorney, Agent, or Firm* — Honigman LLP (57) ABSTRACT

A radar sensor for a vehicular radar sensing system includes a housing structure and at least one printed circuit board (PCB). The housing structure includes a front housing and a rear housing. The PCB is accommodated between the front housing and the rear housing in a cavity established when the front housing and the rear housing are joined together. The rear housing may be joined to the front housing via an intermediate frame disposed between the front housing and the rear housing, with the rear housing secured to the intermediate frame via a plurality of fasteners and with the front housing secured to the intermediate frame via welding.

20 Claims, 7 Drawing Sheets

(56) References Cited

U.S. PATENT DOCUMENTS

| | | |
|---|---|---|
| 7,212,663 B2 | 5/2007 | Tomasi |
| 7,283,213 B2 | 10/2007 | O'Connor et al. |
| 7,310,431 B2 | 12/2007 | Gokturk et al. |
| 7,321,111 B2 | 1/2008 | Bamji et al. |
| 7,340,077 B2 | 3/2008 | Gokturk et al. |
| 7,352,454 B2 | 4/2008 | Bamji et al. |
| 7,375,803 B1 | 5/2008 | Bamji |
| 7,379,100 B2 | 5/2008 | Gokturk et al. |
| 7,379,163 B2 | 5/2008 | Rafii et al. |
| 7,405,812 B1 | 7/2008 | Bamji |
| 7,408,627 B2 | 8/2008 | Bamji et al. |
| 8,013,780 B2 | 9/2011 | Lynam |
| 8,027,029 B2 | 9/2011 | Lu et al. |
| 9,036,026 B2 | 5/2015 | Dellantoni et al. |
| 9,146,898 B2 | 9/2015 | Ihlenburg et al. |
| 9,575,160 B1 | 2/2017 | Davis et al. |
| 9,599,702 B1 | 3/2017 | Bordes et al. |
| 9,689,967 B1 | 6/2017 | Stark et al. |
| 9,753,121 B1 | 9/2017 | Davis et al. |
| 11,096,301 B2 | 8/2021 | Mai |
| 2010/0245066 A1 | 9/2010 | Sarioglu et al. |
| 2013/0027607 A1 | 1/2013 | Jeon et al. |
| 2014/0354878 A1 | 12/2014 | Winter et al. |
| 2015/0029337 A1 | 1/2015 | Uchiyama et al. |
| 2015/0365569 A1 | 12/2015 | Mai et al. |
| 2017/0222311 A1 | 8/2017 | Hess et al. |
| 2017/0254873 A1 | 9/2017 | Koravadi |
| 2017/0276788 A1 | 9/2017 | Wodrich |
| 2017/0315231 A1 | 11/2017 | Wodrich |
| 2017/0356994 A1 | 12/2017 | Wodrich et al. |
| 2018/0015875 A1 | 1/2018 | May et al. |
| 2018/0045812 A1 | 2/2018 | Hess |
| 2018/0231635 A1 | 8/2018 | Woehlte |
| 2019/0195986 A1* | 6/2019 | Hellinger ............ G01S 7/032 |
| 2019/0339382 A1 | 11/2019 | Hess et al. |
| 2020/0137913 A1 | 4/2020 | Wohlte |
| 2020/0137926 A1 | 4/2020 | Wohlte |

\* cited by examiner

VEHICULAR RADAR SENSOR WITH MECHANICAL COUPLING OF SENSOR HOUSING

CROSS REFERENCE TO RELATED APPLICATIONS

The present application is a division of U.S. patent application Ser. No. 16/732,467, filed Jan. 2, 2020, now U.S. Pat. No. 11,096,301, which claims the filing benefits of U.S. provisional application Ser. No. 62/796,652, filed Jan. 25, 2019, and U.S. provisional application Ser. No. 62/787,774, filed Jan. 3, 2019, which are hereby incorporated herein by reference in their entireties.

FIELD OF THE INVENTION

The present invention relates generally to a vehicle sensing system for a vehicle and, more particularly, to a vehicle sensing system that utilizes one or more radar sensors at a vehicle.

BACKGROUND OF THE INVENTION

Use of imaging and radar sensors in vehicle sensing systems is common and known. Examples of such known systems are described in U.S. Pat. No. 8,013,780, which is hereby incorporated herein by reference in its entirety.

SUMMARY OF THE INVENTION

The present invention provides a driver assistance system or vision system or imaging system for a vehicle that utilizes one or more radar sensors to capture sensor data representative of images exterior of the vehicle. The sensor includes a housing structure and at least one printed circuit board (PCB). The housing structure includes a front housing and a rear housing. The front and rear housings may be secured together via a clip element or via an intermediate frame, whereby the PCB is sandwiched or accommodated between the front and rear housings and electrical connection is made between an electrical connection and circuitry of the PCB when the front housing is joined with the rear housing.

These and other objects, advantages, purposes and features of the present invention will become apparent upon review of the following specification in conjunction with the drawings.

DESCRIPTION OF THE PREFERRED EMBODIMENTS

A vehicle sensing system and/or driver assist system and/or driving assist system and/or object detection system and/or alert system operates to capture sensing data exterior of the vehicle and may process the captured data to detect objects at or near the vehicle and in the predicted path of the vehicle, such as to assist a driver of the vehicle or a control for an autonomous vehicle in maneuvering the vehicle in a forward or rearward direction. The system includes a processor that is operable to receive sensing data from one or more sensors and provide an output, such as an alert or control of a vehicle system.

Figure 1:
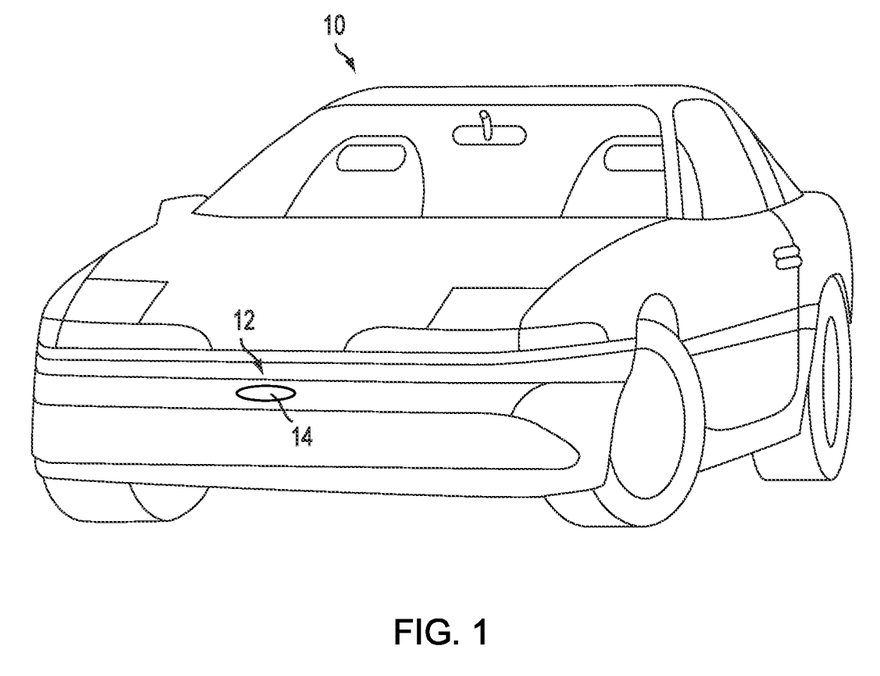
FIG. 1 is a perspective view of a vehicle with a sensing system that incorporates a radar sensor in accordance with the present invention.
Figure 2:
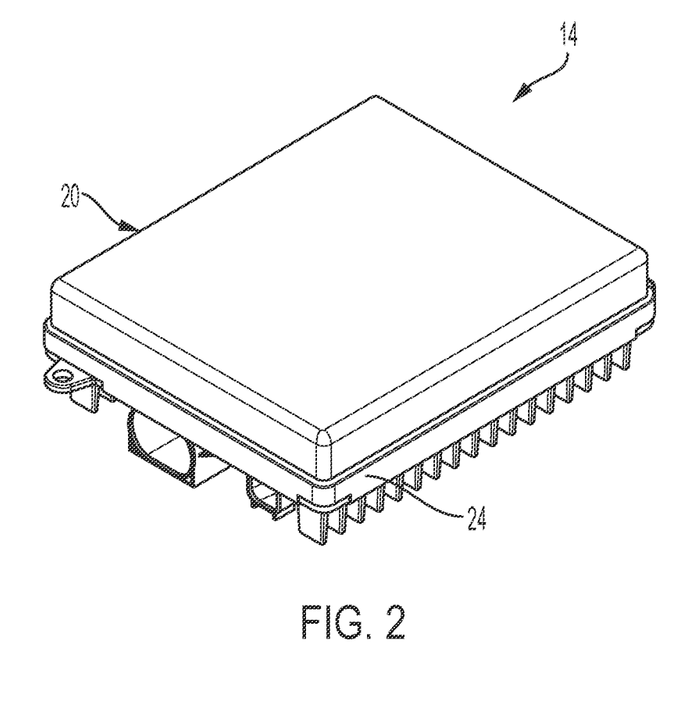
FIGS. 2 and 3 are perspective views of a radar sensor for the sensing system of FIG. 1.
Figure 3:
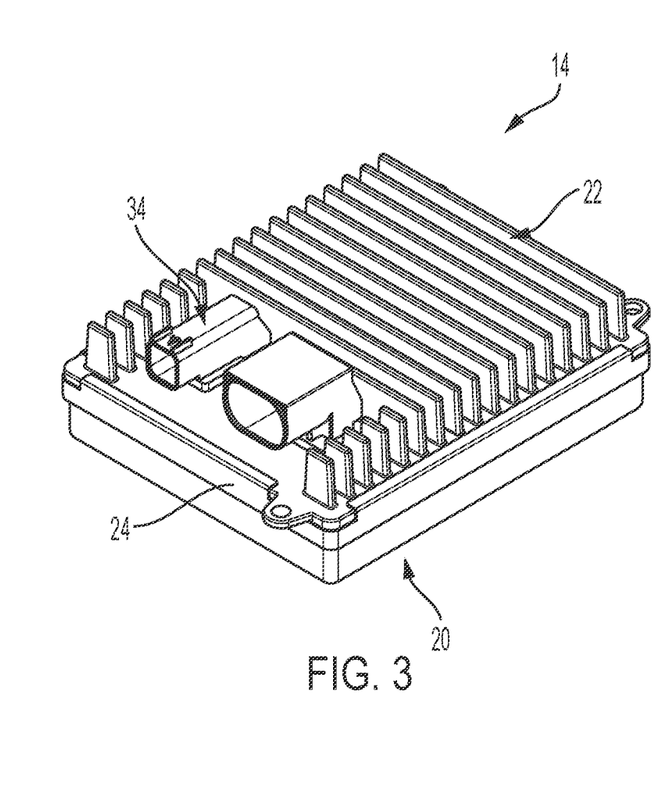

Referring now to the drawings and the illustrative embodiments depicted therein, a vehicle 10 (FIG. 1) includes an driving assistance system or sensing system 12 that includes at least one radar sensor unit, such as a forward facing radar sensor unit 14 (and the system may optionally include multiple exterior facing sensors, such as cameras or other sensors, such as a rearward facing sensor at the rear of the vehicle, and a sideward/rearward facing sensor at respective sides of the vehicle), which sense regions exterior of the vehicle. The sensing system 12 includes a control or electronic control unit (ECU) or processor that is operable to process data captured by the sensor or sensors and may detect objects or the like. The data transfer or signal communication from the sensor to the ECU may comprise any suitable data or communication link, such as a vehicle network bus or the like of the equipped vehicle.

The radar sensor or sensors of the driving assist system may be used in conjunction with a plurality of image sensors mounted at the equipped vehicle and/or with at least one lidar sensor also mounted (along with the image sensors and the radar sensor) at the equipped vehicle. Image data and/or radar data and/or lidar data may be provided to a central electronic control unit (ECU) or module for processing thereat. The ECU includes at least one processor that processes the captured/sensed data, whereby one or more functions or systems (such as a braking system and/or steering system and/or the like) of the vehicle is controlled responsive to processing of the captured/sensed data.

The radar sensor of the vehicular sensing system includes a plurality of transmitter antennas and a plurality of receiver antennas, which may be disposed on a printed circuit board (PCB) that includes associated circuitry.

Automotive radar sensors are space sensitive. Antennas of the sensors typically face a front housing. The front housing is generally constructed of plastic. Integrated circuits (ICs), systems on a chip (SoCs), and other processors generate heat on printed circuit boards (PCBs) disposed within or behind the front housing that often are managed via thermally coupling to a heat sink. For example, when necessary, a back housing of the radar sensor may include a heat sink. The back housing may then be used for heat transfer and tolerance compensation.

As shown in FIGS. 2-5, a front housing or cover 20 of the radar sensor 14 is attached at a rear housing 22, such as via a clip or element or crimp frame 24 that engages both the front housing 20 and the rear housing 22 to secure the housing parts together, with the printed circuit board 26 (having the 3D antenna disposed thereat) encased in the housing and sandwiched between the front and rear housing portions. The clip 24 at least partially circumscribes the junction or mating interface between the front housing and the rear housing. For example, and such as can be seen with reference to FIGS. 2, 3 and 5, the clip or crimp frame 24 substantially or fully circumscribes the mating interface, with the crimping tabs removed at the corners to allow for bending or forming of the crimp frame at the corner regions. The clip may comprise an open ring or structure (having spaced apart ends) so as to partially circumscribe the mating interface so that the clip may be opened and folded or bent around the mating interface, whereby the crimping tabs may be bent or folded and crimped at the respective front or rear housing. Optionally, the clip may comprise a closed ring or structure so as to fully circumscribe the mating interface, whereby the crimping tabs and center portion of the clip may initially be generally coplanar to allow the clip to slide along the front or rear housing into place at the mating interface, whereby the crimping tabs are bent or folded and crimped at the respective front or rear housing.

Figure 4:
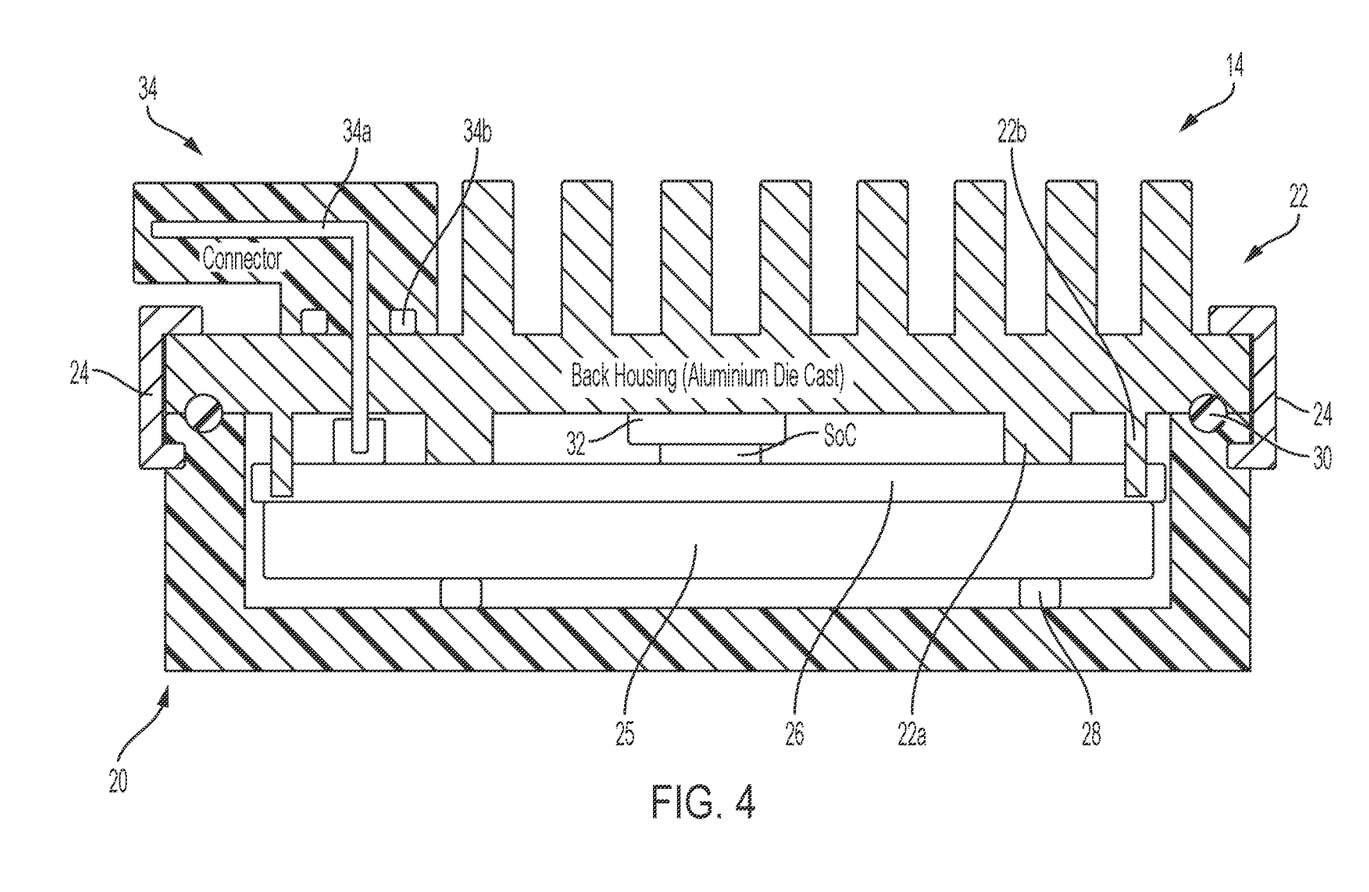
FIG. 4 is a sectional view of the radar sensor of FIGS. 2 and 3.

In the illustrated embodiment, and such as best shown in FIG. 4, the clip engages a groove or channel formed at the outer wall or surface of the plastic front housing and encompasses and overlaps the periphery of the rear housing, such that a rear portion of the clip overlaps a rear perimeter surface of the rear housing. The clip comprises a metal part (such as a strip of sheet metal or stamped part) that is bent around the front and rear housings to join the housings together. The front housing or cover 20 may be made of plastic or other non-conducting material, and the rear housing 22 comprises a metallic material, such as aluminum (where the rear housing may comprise a die cast aluminum part) or the like.

Figure 5:
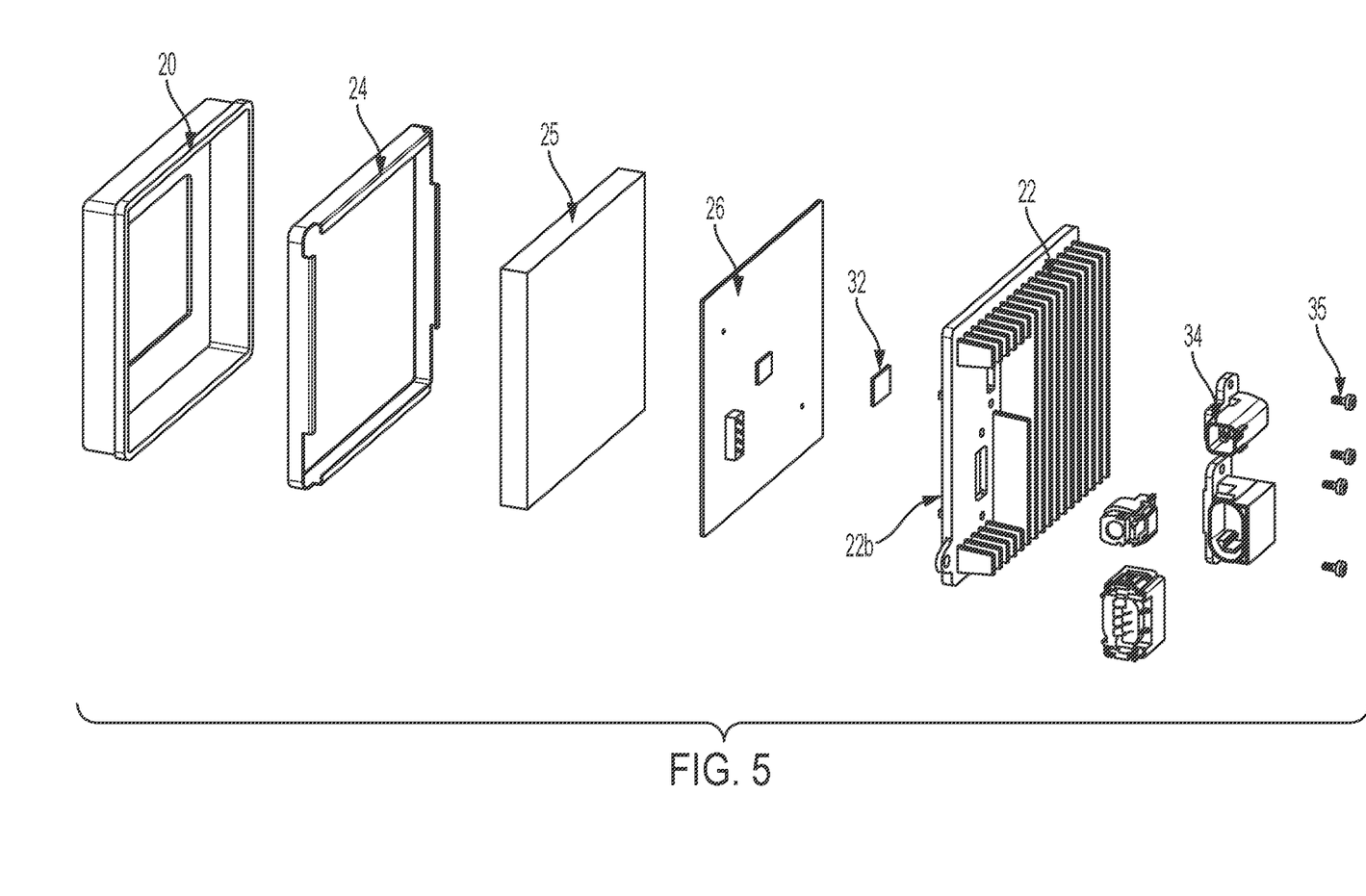
FIG. 5 is an exploded perspective view of the radar sensor of FIGS. 2 and 3.
Figure 6:
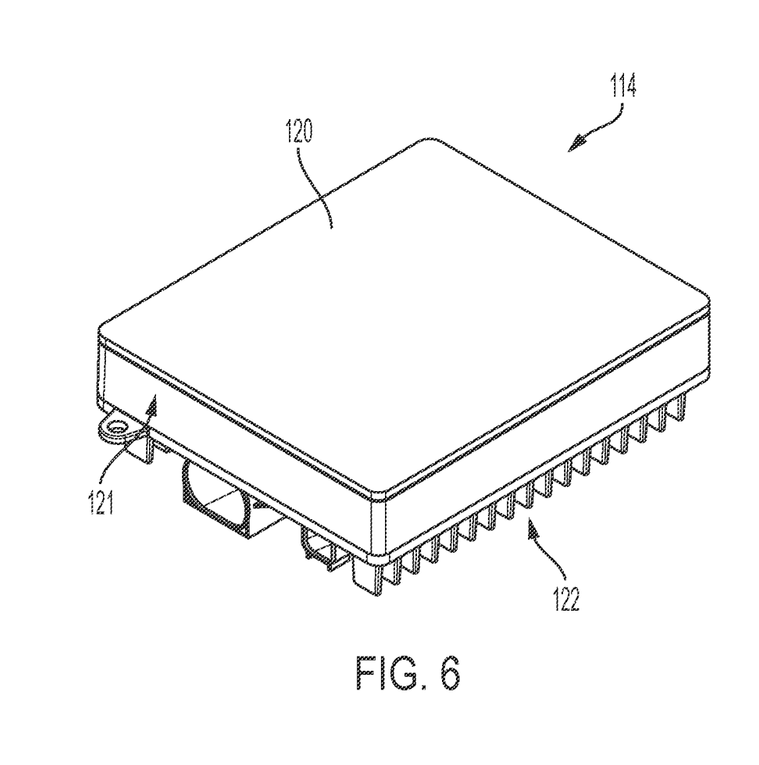
FIGS. 6 and 7 are perspective views of another radar sensor for the sensing system of FIG. 1.
Figure 7:
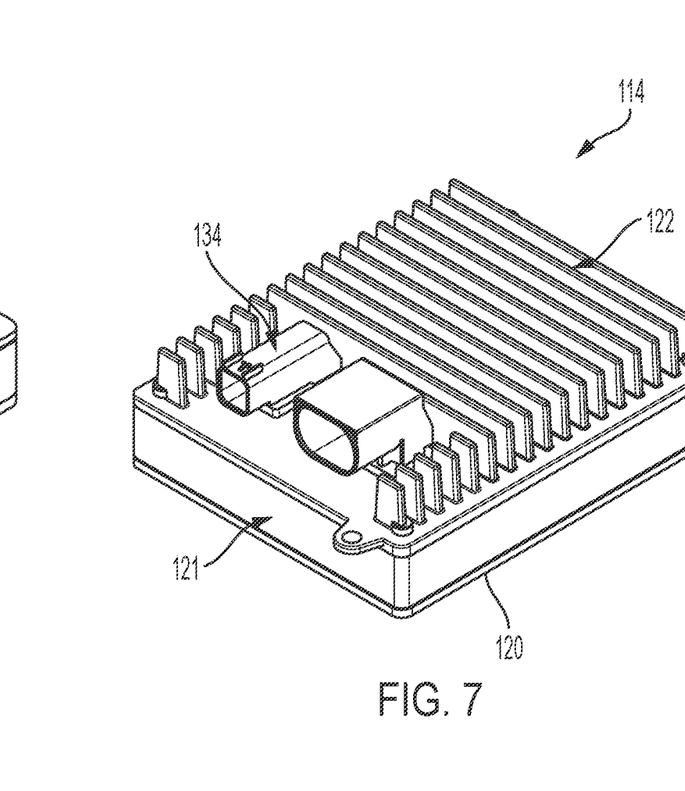
Figure 8:
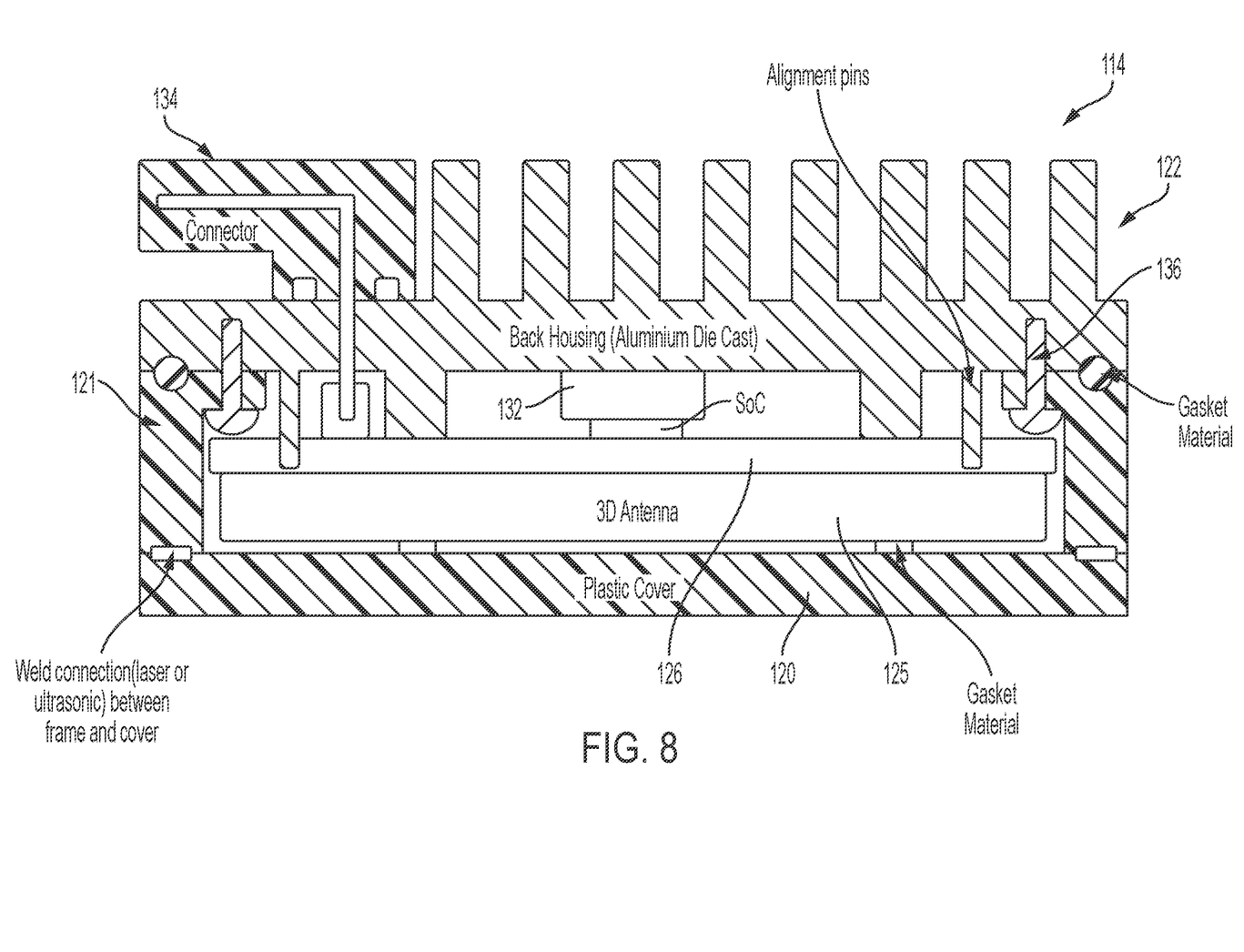
FIG. 8 is a sectional view of another radar sensor of FIGS. 6 and 7.
Figure 9:
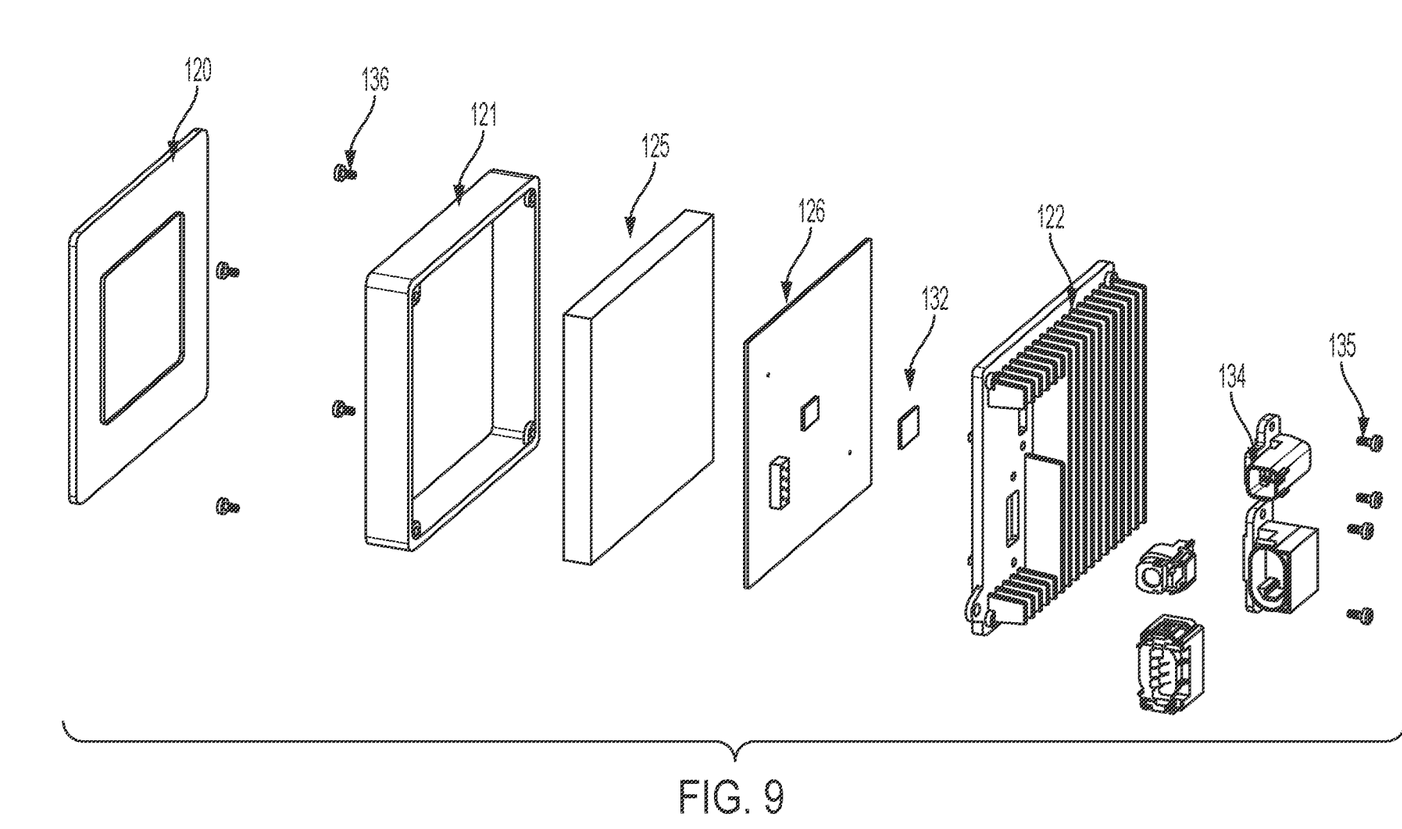
FIG. 9 is an exploded perspective view of the radar sensor of FIGS. 6-8.

The sensor includes gasket material or elements 28 disposed between the front housing 20 and the 3D antenna or PWG antenna 25 of the PCB 26 and gasket material or elements 30 disposed between the front housing 20 and the rear housing 22. When the front and rear housings are joined, the PCB 26 is sandwiched or clamped between the rear housing 22 (via posts or protrusions 22a of the rear housing) and the front housing 20 (via the gasket elements 28 at the front housing). The PCB 26 includes a system on chip (SoC), which may be thermally coupled with a thermal material or thermally conductive element 32 at the rear housing, so that heat generated by the SoC during operation of the sensor is drawn away from the PCB and to the rear housing 22, whereby the heat may be dissipated via cooling fins of the rear housing.

The radar sensor 14 further includes an electrical connector element 34 disposed at the rear housing 22. The connector element 34 may comprise two separate connectors with insert molded pins 34a and gaskets 34b for sealing between the connectors and the rear housing and around the location where the pins insert through the rear housing. The connector element(s) 34 is attached at the rear of the rear housing 22 (such as via welding or bonding or via one or more fasteners 35), whereby pins or terminals of the connector elements protrude through apertures through the rear housing and into corresponding connectors at the PCB 26. During assembly of the rear housing to the front housing, alignment pins 22b of the rear housing 22 engage and pass at least partially into or through alignment apertures in or through the PCB 26, whereby the connector pins are aligned with the connectors at the PCB, so that electrical connection is made as the rear housing is attached at and joined with the front housing.

Optionally, and with reference to FIGS. 6-9, a radar sensor 114 includes a front housing 120 and a rear housing 122, which are spaced apart and joined via an intermediate plastic frame 121. In the illustrated embodiment, the front housing 120 is attached at a front part of the frame 121 via a weld connection (such as via laser or ultrasonic welding), and the rear housing 122 is attached at a rear part of the frame 121 via threaded fasteners or screws 136 (such as, for example, four fasteners or screws). Such a construction allows for the frame to be fastened to the rear housing and the PCB 126 to be disposed at and connected to the rear housing and connector terminals of the connector(s) 134 (attached at the rear housing via fasteners or screws 135), whereby the front housing is welded to the frame to encase the PCB in the sensor unit. Similar to radar sensor 14, discussed above, the PCB 126 has a SoC at the thermal material 132, and the radar sensor has a 3D antenna or PWG antenna 125 sandwiched between the PCB and the front cover 120, whereby the PCB assembly is clamped between the rear housing and the front housing or cover. The radar sensor 114 may otherwise be similar to the radar sensor 14, discussed above.

Optionally, the radar sensor may include a thermally conductive element that extends or protrudes from (or is part of) the rear housing (e.g., a metallic rear housing) and that contacts and is thermally coupled with the rear of a printed circuit board that has circuitry disposed thereat that generates heat during operation of the sensor, such as by utilizing aspects of the radar sensors and systems described in U.S. patent application Ser. No. 16/662,205, filed Oct. 24, 2019, which published on Apr. 30, 2020 as U.S. Publication No. US-2020-0137926, which is hereby incorporated herein by reference in its entirety. Optionally, the radar sensor may have slots for receiving the printed circuit board or boards thereat, such as by utilizing aspects of the radar sensors and systems described in U.S. provisional application Ser. No. 16/665,403, filed Oct. 28, 2019, which published on Apr. 30, 2020 as U.S. Publication No. US-2020-0137913, which is hereby incorporated herein by reference in its entirety.

Thus, the present invention provides a modular radar sensor that simplifies assembly by providing for mechanical attachment of the front housing to the rear housing, such as via a fastener or external clip or element.

The sensing system may include any type of sensor or sensors, such as imaging sensors or radar sensors or lidar sensors or ultrasonic sensors or the like. For example, the system may utilize radar or lidar sensors or the like, and may utilize aspects of the systems described in U.S. Pat. Nos. 9,753,121; 9,689,967; 9,599,702; 9,575,160; 9,146,898; 9,036,026; 8,027,029; 8,013,780; 6,825,455; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438; 7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0231635; US-2018-0045812; US-2018-0015875; US-2017-0356994; US-2017-0315231; US-2017-0276788; US-2017-0254873; US-2017-0222311 and/or US-2010-0245066, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A radar sensor for a vehicular radar sensing system, wherein the radar sensor is configured to be disposed at a vehicle so as to sense exterior of the vehicle, the radar sensor comprising:

a housing structure and at least one printed circuit board (PCB);

wherein the housing structure comprises a front housing, a rear housing and an intermediate frame disposed between the front housing and the rear housing;

wherein the PCB is accommodated between the front housing and the rear housing in a cavity established when the front housing and the rear housing are joined together via the intermediate frame;

a system on chip disposed at the PCB, wherein the system on chip does not directly engage the rear housing;

a thermally conductive element disposed between and engaging the system on chip and the rear housing;

wherein the rear housing is secured to the intermediate frame via a plurality of fasteners; and wherein the front housing is secured to the intermediate frame via welding.

2. The radar sensor of claim 1, wherein the rear housing comprises an opening, and wherein the opening provides for a connecting element of an electrical connector to pass through to make electrical connection with a connector at the PCB.

3. The radar sensor of claim 2, wherein the electrical connector is attached to the rear housing after joining the rear housing and the front housing.

4. The radar sensor of claim 1, wherein the rear housing includes at least one alignment pin protruding therefrom, and wherein the at least one alignment pin is received in at least one alignment aperture at the PCB to align the PCB with the rear housing during assembly of the radar sensor.

5. The radar sensor of claim 1, wherein the PCB is engaged with the rear housing via a plurality of protrusions at the rear housing and is engaged with the front housing via at least one gasket element at the front housing.

6. The radar sensor of claim 1, wherein the front housing comprises a plastic front housing formed of plastic material.

7. The radar sensor of claim 6, wherein the intermediate frame comprises a plastic intermediate frame formed of plastic material.

8. The radar sensor of claim 7, wherein the rear housing comprises a metallic rear housing formed of metallic material.

9. The radar sensor of claim 1, wherein the rear housing includes a plurality of heat dissipating fins.

10. The radar sensor of claim 1, wherein the front housing is secured to the intermediate frame via laser welding.

11. The radar sensor of claim 1, wherein the front housing is secured to the intermediate frame via ultrasonic welding.

12. A radar sensor for a vehicular radar sensing system, wherein the radar sensor is configured to be disposed at a vehicle so as to sense exterior of the vehicle, the radar sensor comprising:

a housing structure and at least one printed circuit board (PCB);

wherein the housing structure comprises a front housing, a rear housing and an intermediate frame disposed between the front housing and the rear housing;

a system on chip disposed at the PCB;

wherein the PCB is accommodated between the front housing and the rear housing in a cavity established when the front housing and the rear housing are joined together via the intermediate frame;

wherein the rear housing includes at least one alignment pin protruding therefrom, and wherein the at least one alignment pin is received in at least one alignment aperture at the PCB to align the PCB with the rear housing during assembly of the radar sensor;

wherein the system on chip does not directly engage the rear housing;

a thermally conductive element disposed between and engaging the system on chip and the rear housing; and wherein the rear housing includes a plurality of heat dissipating fins.

13. The radar sensor of claim 12, wherein the rear housing comprises an opening, and wherein the opening provides for a connecting element of an electrical connector to pass through to make electrical connection with a connector at the PCB.

14. The radar sensor of claim 13, wherein the electrical connector is attached to the rear housing after joining the rear housing and the front housing.

15. A radar sensor for a vehicular radar sensing system, wherein the radar sensor is configured to be disposed at a vehicle so as to sense exterior of the vehicle, the radar sensor comprising:

a housing structure and at least one printed circuit board (PCB);

wherein the housing structure comprises a front housing, a rear housing and an intermediate frame disposed between the front housing and the rear housing;

a system on chip disposed at the PCB;

wherein the PCB is accommodated between the front housing and the rear housing in a cavity established when the front housing and the rear housing are joined together via the intermediate frame;

wherein the PCB is engaged with the rear housing via a plurality of protrusions at the rear housing and is engaged with the front housing via at least one gasket element at the front housing;

wherein the system on chip does not directly engage the rear housing;

a thermally conductive element disposed between and engaging the system on chip and the rear housing; and wherein the rear housing includes a plurality of heat dissipating fins.

16. The radar sensor of claim 15, wherein the rear housing comprises a metallic rear housing formed of metallic material.

17. The radar sensor of claim 15, wherein the front housing is secured to the intermediate frame via laser welding.

18. The radar sensor of claim 15, wherein the front housing is secured to the intermediate frame via ultrasonic welding.

19. The radar sensor of claim 15, wherein the rear housing comprises an opening, and wherein the opening provides for a connecting element of an electrical connector to pass through to make electrical connection with a connector at the PCB.

20. The radar sensor of claim 19, wherein the electrical connector is attached to the rear housing after joining the rear housing and the front housing.

* * * * *